Figure 1:
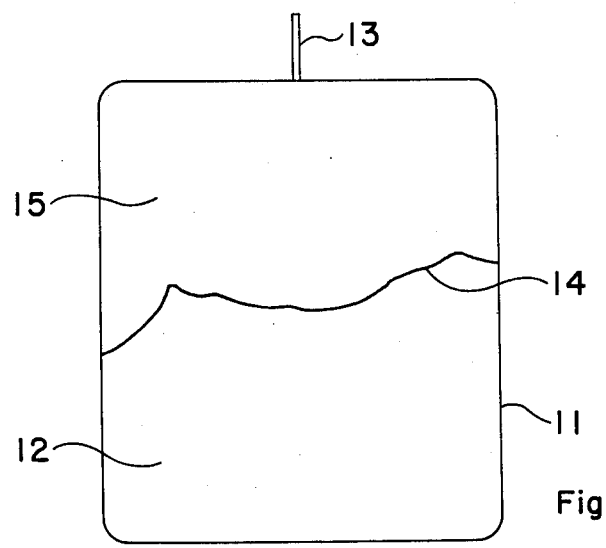

United States Patent [19]

Luch

[11] 4,009,093
[45] Feb. 22, 1977

[54] PLATABLE POLYMERIC COMPOSITION

[75] Inventor: Daniel Luch, Warwick, N.Y.

[73] Assignee: The International Nickel Company, Inc., New York, N.Y.

[22] Filed: Nov. 27, 1974

[21] Appl. No.: 527,532

Related U.S. Application Data

[62] Division of Ser. No. 408,410, Oct. 23, 1973, Pat. No. 3,865,699.

[52] U.S. Cl. .............................. 204/291; 204/294; 252/510; 252/511
[51] Int. Cl.² ......................................... C25B 11/04
[58] Field of Search .......................... 252/510, 511; 260/42.39; 204/25, 30, 23, 27, 29, 294, 291

[56] References Cited

UNITED STATES PATENTS

| 2,776,253 | 1/1957 | Scholl | 204/30 X |
|---|---|---|---|
| 3,104,985 | 9/1963 | Williams et al. | 252/511 X |
| 3,507,773 | 4/1970 | Grangaard | 204/294 |
| 3,641,211 | 2/1972 | Strange et al. | 260/42.39 X |
| 3,669,828 | 6/1972 | Usamoto et al. | 260/42.39 X |
| 3,682,786 | 8/1972 | Brown et al. | 204/30 |

Primary Examiner—Benjamin R. Padgett
Assistant Examiner—E. Suzanne Parr
Attorney, Agent, or Firm—Francis J. Mulligan, Jr.; Ewan E. MacQueen

[57] ABSTRACT

A process for metalizing a non-conductive substrate wherein the substrate is coated with an organic polymer-carbon black mixture, having a volume resistivity of less than about 1000 ohm-centimeters, the surface of the mixture is caused to contain sulfur and the thus treated substrate is placed as a cathode in a nickel, cobalt or iron plating bath to cause a rapid spread of metal across the thus treated surface.

2 Claims, 2 Drawing Figures

PLATABLE POLYMERIC COMPOSITION

The present application is a divisional application of U.S. application Ser. No. 408,410 filed Oct. 23, 1973, now U.S. Pat. No. 3,865,699 issued on Feb. 11, 1975.

The present invention is concerned with electrodeposition and more particularly with electroplating of a non-electrically conductive substrate.

BACKGROUND OF THE INVENTION

Since the start of electroplating, a large number of proposals have been made with respect to electroplating on non-electrically-conductive substrates ranging in size and shape across the gamut of leaves, flowers, baby shoes, plastic knobs, bottle tops, molded plastic parts for automotive usage and uncounted other practical and decorative structures. Basically, two processes have been used. The first process involves the coating of the non-conductive object with an electrically conductive lacquer followed by electroplating. The second process involves sensitizing the non-conductive object, chemically depositing a metal on the sensitized surface and thereafter electroplating the thus metallized surface.

The two generally available processes as practiced in the prior art have certain disadvantages. Because of high loadings of conductive pigments such as graphite or metal, prior art conductive lacquers are generally very weak and thus constitute a weak link in the ultimate electroplated structure. A variation of the lacquer process which involves coating the tacky lacquer surface with graphite again produces very weak bonds between electrodeposited metal and the lacquer much like the ephemeral bond produced between graphitized wax and electrodeposited metal in the electrotyping process. If lower pigment loadings are used in a conductive lacquer to give greater strength in the lacquer, the rate of initial metal coverage of the article during electroplating is radically decreased necessitating the use of multiple electrical contact points on the object to be plated or allowance of a long time for metal coverage and consequent uneven plating thicknesses.

The second process as generally practiced by the prior art, can achieve good results but only at a cost of employing a large number of individual processing operations carried out with very great care by skilled personnel. Furthermore, because the underlying chemically deposited metal can be different from metal subsequently electrochemically deposited, there is a good chance of forming an electrochemical couple between the two even when, nominally the metals are the same. Thus the possibility of accelerated, localized corrosion exists wherever and whenever the outer electrodeposited layer is not continuous.

Recently, U.S. Pat. No. 3,523,875 to Minklei and No, 3,682,786 to Brown et al have issued. These recently issued patents are worthy of discussion because, superficially they might appear to resemble the process of the present invention. Minklei proposed to treat a plastic surface with an aqueous solution of alkali metal sulfide followed by contacting the treated surface with a metal salt prior to electroplating. Brown et al proposed contacting a plastic surface with a solution or dispersion of sulfur in an organic medium and contacting the treated surface with an aqueous solution of cuprous salt prior to plating. In both instances, the proposals involve the formation of a metal sulfide on the plastic surface and not the type of metal-polymer bond, which, as will become apparent from the subsequent description, is formed by virtue of the process of the present invention.

OBJECTS

It is an object of the present invention to provide a process for electrodepositing metal on non-electrically-conductive substrates.

It is another object of the present invention to provide a process for electrodeposition on substrates which are not amenable to ordinary electrodeposition techniques.

Figure 2:
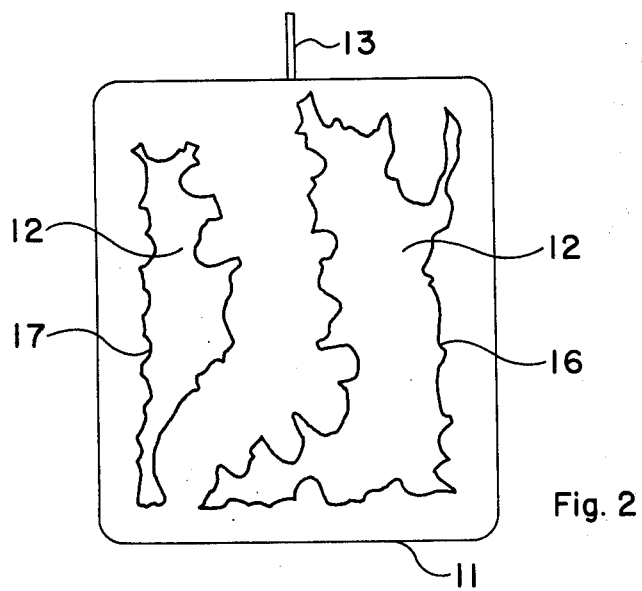

Other objects and advantages will become apparent in light of the following description taken in conjunction with the drawing in which FIG. 1 depicts electrodeposit growth obtained in accordance with the present invention and; FIG. 2 depicts undesirable electrodeposit growth obtained when an essential requirement of the process of the present invention is omitted.

DESCRIPTION OF THE INVENTION

Generally speaking the present invention contemplates a process wherein at least part of a substrate for electrodeposition comprises or is coated with an adherent layer of a mixture of an organic polymer and an electrically conductive carbon black of such proportion so as to have an electrical resistivity of less than about 1000 ohm-centimeter; at least the exposed surface of the layer is caused to contain an effective amount of sulfur, and the thus coated object is then introduced into a nickel, cobalt, or iron plating bath as the cathode to cause rapid deposition of metal across the coated surface. Thereafter the metal coated object can be subjected to further electrodeposition in ways well known to those skilled in the art.

The polymer used along with conductive carbon black in the coating layer (and which may also constitute the substrate) is, advantageously a member of the group of organic polymers which readily react with molecular sulfur or a sulfur donor of the type described herein. Advantageous polymers for use in the process of the present invention include hydrocarbonaceous and substituted hydrocarbonaceous elastomers such as natural rubber, polychloroprene, butyl rubber, chlorinated butyl rubber, polybutadiene rubber, acrylonitrile-butadiene rubber, styrene-butadiene rubber, etc. These elastomers are unsaturated and readily combine with molecular sulfur through either unsaturated linkages in the carbon skeletal structure of the polymer or through activated sites on the polymer structure associated with unsaturated linkages or pendant substituent atoms. Another advantageous type of polymer for use in the process of the present invention is an ethylene-propylene terpolymer comprising a saturated polyethylene-propylene main chain having unsaturated groups derived from non-conjugated dienes, e.g., hexadiene, dicyclopentadiene etc., pendant from the main chain. Such a terpolymer is readily vulcanized with sulfur. Other polymers useful in the process of the present invention include essentially saturated polymers such as polystyrene, polyvinyl chloride, polyurethane etc., which apparently possess active sites for reaction with sulfur. While polyethylene (and similar polymers of limited solubility) are not readily suited for use in coating formulations, it has been found that milled and molded polyethylene compositions containing carbon black and a sulfur donor can advantageously be employed in the process of the present invention. Undoubtedly some organic polymers, for example, perhaps, polytetrafluoroethylene are too inert to react with sulfur and these polymers are excluded from the ambit of the present invention. However, the great bulk of normally used organic polymeric materials appears to be useable in the process of the present invention.

Of those polymers which react with sulfur, those having elastomeric characteristics e.g., rubbers, elastomeric polyurethane etc., are considered to be advantageous when used as a coating covering a rigid base and overlied by the deposited metal, because an elastomer has the ability to dampen stress concentrations which can result in failure of the deposited coating upon exposure to applied stress or thermal cycling. In addition, with most elastomers, the carbon black included for the purpose of providing a proper degree of electrical conductivity acts as a reinforcement agent to improve the physical characteristics of the elastomer. Further factors which make elastomers most advantageous include rapidity of metal coverage and relatively low cost of materials. Among the elastomers, the unsaturated elastomers are deemed to be the most advantageous.

Those skilled in the art will appreciate that in the foregoing description of polymers operable in the process of the present invention the examples given are merely illustrative and that many other polymeric and copolymeric materials and mixtures can be used in place of the specifically mentioned substances. For example, very often in rubber formulations amounts of compatible non-elastomeric resins are included for various purposes. Polymers other than rubber can, and often are compounded with plasticizers in order to obtain a product having flexibility. Such compounded materials as well as copolymers and mixed polymers are operable for purposes of the present invention.

When as is always advantageous the exposed surface of the polymer-conductive carbon black composition is caused to contain sulfur it is possible that the sulfur initially attacks the polymer chain at activated positions, to provide activated sites for bonding of nickel to the polymer. Regardless of the theoretical explanation however, applicant's experiments have shown that when nickel deposits are made in accordance with the teachings of the present invention very strong, highly useful metal to organic bonds are formed very rapidly on polymer-carbon black surfaces. It is important to avoid overcuring of a polymer with sulfur (or other curative) prior to plating. It appears that a polymer-sulfur-metal bond can occur with most polymers as long as activated sites on the polymer chain exist. Heavy curing, especially in sulfur monochloride will remove these sites from an unsaturated elastomer causing poor plating both as to speed of coverage and as to adherence of the metal.

The exposed surface of the polymer-carbon black plating substrate can contain sulfur by inclusion of sulfur in the whole mass of the plating substrate or by enriching the exposed surface with sulfur.

Normally, a plating substrate containing an unsaturated polymeric elastomer will contain about 0.5% to about 5% of sulfur based upon weight of elastomer in order to permit curing of the elastomer. When agents other than sulfur or sulfur compounds are used for curing the exposed surface of the elastomer can be enriched in sulfur by contacting the surface with a solution containing elemental sulfur or by exposing the surfaces to a sulfur-containing vapor e.g., the vapor of sulfur monochloride ($S_2Cl_2$). The plating substrate will normally contain ingredients other than sulfur, elastomer and conductive carbon black such are normally included in rubber compositions. Such other ingredients include vulcanization accelerators and modifiers, antioxidants and similar types of materials which have been found to be useful in rubber technology. For best results, particularly with respect to adhesion of electrodeposited metal all ingredients should be limited in amount to amounts which will be permanently soluble in the cured elastomer at normal temperatures i.e., about 25° C.

Plating substrates used in the present invention usually contain carbon black and polymer in weight ratios of about 0.2 to about 1.5 (conductive carbon black to polymer) although somewhat higher or lower weight ratios can be used. It is usually more advantageous to employ weight ratios of conductive carbon black to polymer in the range of about 0.5 to 1.0. It has been noted with coatings on non-electrically conductive substrates that speed of coverage of polymer-carbon black surfaces becomes very low at very high loadings of carbon black indicating that a minimum surface concentration of polymer is necessary not only for attaining mechanical strength but also for purposes of facilitating the metal spreading mechanism of the invention. Because carbon blacks vary greatly depending upon sources and methods of manufacture, it is not practical to specify with more precision the relative amounts of polymer and carbon black required in accordance with the present invention. In addition to variations involved in different types of carbon black, difference in dispersion conditions when compounding with polymer can also introduce variations in the polymercarbon black mixtures. For example, if an acetylene black sold by Shawinigan Products Corp. of Englewood Cliffs, New Jersey, is milled with an elastomer in a Banbury-type mill, it is likely that at least part of the chain-like structures of the acetylene black will be broken. On the other hand using less agressive mixing techniques, the chain structure will be retained. Consequently, the composition milled in the Banbury mixer will exhibit a higher volume resistivity than will a composition milled in solution form in a blender even though the loading of the carbon black is the same. Thus for purposes of the invention, the criterion of operability of a particular polymer-carbon black mixture is the electrical volume resistivity. As stated hereinbefore, the volume resistivity must be less than about 1000 ohm-centimeters and more advantageously is less than about 10 ohm-centimeters. Ordinarily it is neither possible nor desirable to obtain polymer-carbon black mixtures having volume resistivities less than about 1 ohm-centimeter. At such low resistivities, the strength of the polymer-carbon black mixture is low. Optimum results have been obtained using conductive carbon blacks made from acetylene such as sold by Shawingan Products Corporation under the trade designation Acetylene Carbon Black. Another commercially available conductive carbon black which possesses relatively high resistance to mechanical breakdown during milling with a polymer is sold by Cabot Corporation under the trade designation of Vulcan XC72. If desired, mixtures of conductive and non-conductive carbon blacks can be used provided that the final polymer-carbon black product has a volume resistivity in the range set forth hereinbefore. In some instances the proper volume resistivity can be achieved in polymer-carbon black compositions which are made entirely with non-conductive carbon blacks for example, furnace blacks. Such compositions ordinarily do not have adequate electrical characteristics when used as coatings and dried on a substrate. However, these compositions may have adequate characteristics for use as molded, extruded or like-formed shapes which can be treated electrochemically in accordance with the present invention without a separate preliminary coating step.

The rate of coverage of nickel cobalt or iron on a cathode having a surface of polymer-carbon black mixture in accordance with the present invention extending from a point of contact with an electronic conductor (e.g., a metal) is dependent at least upon the resistivity of the mixture, the sulfur content at the mixture surface, the applied voltage across the anode-electrolyte-cathode circuit; and the nature of the polymer. Generally speaking in accordance with the present invention the minimum rate at which nickel spreads across the cathode surface at a voltage of 3.0 volts is about 0.5 centimeter per minute (cm/min.). A series of polymer-acetylene black compositions were made containing 100 parts by weight of polymer and 50 parts by weight of the carbon black. The compositions devoid of sulfur were coated on an ABS panel having a metal contact point at one end. In a first series of tests the panels were immersed in a Watts' type nickel plating bath as cathodes at a voltage of 3.0. The rate of nickel coverage was measured. In a second series of tests, the panels were dipped in a solution of 1% (by weight) of sulfur in cyclohexane, removed and the cyclohexane allowed to evaporate prior to electrolytic treatment in exactly the same manner as was the first series. The results of these tests are set forth in Table I.

TABLE I

| Polymer | Ni coverage rate (cm/min) | |
|---|---|---|
| | Series I | Series II |
| Polystyrene | 0.25 | 1.19 |
| Polyvinyl chloride | 0.15 | 0.99 |
| Chlorinated Rubber (Parlon) | 0.31 | 0.89 |
| Nitrile Rubber (Paracril BJLT) | 0.31 | 2.24 |
| Natural Rubber (Smoked Sheet) | 0.31 | 0.89 |
| Neoprene Rubber (Neoprene AD) | 0.58 | 1.78 |

Table I shows that a very small amount of sulfur incorporated in the exposed surface of the polymer increases nickel coverage rates by a factor of at least about 2.5. When sulfur is included in the polymer-carbon black compositions and not merely in the very surface layer as in the materials of Series II Table I, rates of nickel coverage can be much higher. For example, with a composition containing 100 parts by weight nitrile rubber, 50 parts by weight acetylene black and 4 parts by weight sulfur, nickel coverage rates at 3.0 volts of over 6 cm/min. can be obtained. The rate of nickel coverage increases linearly with increases in voltage. Using a composition containing a weight ratio of 2 to 1 of nitrile rubber to acetylene black and 2.5% by weight of sulfur based upon the weight of rubber, a nickel coverage rate of about 9.5 cm/min. was obtained at a voltage of 3.0 and a rate of about 14.7 cm/min. at a voltage of 4.5. It is important that the sulfur present in the polymer-carbon black compositions be in the form of non-ionic sulfur, i.e., that it not be tied up as a metal sulfide or in a stable ion such as the sulfate ion. Ordinarily, elemental sulfur is used but, if desired, sulfur in the form of a sulfur donor such as sulfur chloride, 2-mercapto-benzothiazole, N-cyclohexyl-2-benzothiozole sulfonomide, dibutyl xanthogen disulfide and tetramethyl thiuram disulfide or combinations of these and sulfur can also be employed. Those skilled in the art will recognize that these sulfur donors are the materials which have been used or have been proposed for use as vulcanizing agents or accelerators.

The advantage obtained when sulfur is included in the polymer-carbon black surface is dramatically depicted in the drawing. Referring now thereto both FIGS. 1 and 2 depict indentical acrylonitrile-butadiene-styrene plaques 11 coated with polymer-carbon black coating 12 containing 20 parts by weight of neoprene and 10 parts by weight of acetylene black and having a wire contact 13.

The coating 12 of FIG. 1 initially contained a small amount of thiuram and was treated with a 1% by weight solution of sulfur in cyclohexane prior to plating so as to incorporate a small effective amount of sulfur in the coating. Coating 12 of FIG. 2 was made with a neoprene free of thiuram, was not exposed to a sulfur solution and therefore contained no sulfur. Both plaques were made cathodic under identical voltage conditions (3 volts closed circuit cell potential) in the same nickel plating bath. After 1½ minutes the area 15 above line 14 in FIG. 1 was uniformly coated with a highly adherent nickel deposit. At this time the plaque was removed from the plating bath. If it were not removed from the bath, the plating front, as depicted by line 14, would continue downwardly across plaque 11 of FIG. 1 until, at the end of about 5 minutes the whole plaque would be coated with a firm, adherent, even deposit of nickel. In contrast, the plaque of FIG. 2, after 20 minutes in the plating bath, had loosely adherent fernlike deposit on the area external of closed, irregular curves 16 and 17 leaving sulfur-free coating 12 exposed internally of closed irregular curves 16 and 17. A comparison of FIGS. 1 and 2 of the drawing clearly shows that plating practice in accordance with the present invention is highly advantageous.

The cathodic electrolytic treatment used according to the present invention to induce nickel coverage across the expanse of polymer-carbon black mixture surface is carried out in an electrolytic bath from which nickel can be deposited and which, ordinarily is aqueous and contains about 70 to about 120 grams per liter (gpl) of nickel ion, complementing anion from the group of sulfate, chloride, sulfamate, fluoborate and mixtures thereof and exhibits a pH of about 2.8 to about 4.5 stabilized by inclusion of a buffer such as boric acid in the bath. An ordinary Watts bath is quite satisfactory for use both as the initial bath for nickel coverage and for subsequent plating. If desired, after nickel coverage has been established, one can plate in a nickel bath containing any kind of additive, e.g., levelling agents or brightening agents, etc., known to the art. Further, after nickel coverage is established one can plate not only with nickel but also with any other electrodepositable metal compatible with nickel, e.g., chromium, copper, zinc, tin, silver, gold, platinum, palladium, cadmium etc.

The cathodic treatments in accordance with the invention to induce the growth of iron or cobalt across the polymer carbon-black surface can be carried out in any electroplating bath from which these metals can be deposited. For example, the process of the invention has been carried out using an aqueous ferrous chloride bath to deposit iron and an aqueous cobalt chloride-cobalt sulfate bath to deposit cobalt. Details of operation for these and other iron, cobalt and nickel baths can be obtained from any text on electroplating, for example, Electoplating Engineering Handbook, Edited by A. Kenneth Graham, Reinhold Publishing Corporation, Copyright 1955. Those skilled in the art will appreciate that for particular purposes it may be advantageous to deposit alloys of nickel, cobalt and iron such as iron-nickel alloys, nickel-cobalt alloys etc.

In addition to iron, nickel and cobalt, other metals of Group VIII of the Periodic Table of Elements can be deposited in the manner as depicted in FIG. 1 of the drawing, that is initially behind a deposition front moving across the polymer-carbon black surface. In particular palladium has been found to spread across a polymer-carbon black surface at a rate roughly equivalent to the rate at which iron spreads, which rate is somewhat slower than the spreading rate of nickel and cobalt all other conditions being equal.

While the present invention is especially concerned with electrodeposition of metal on a wide variety of plastic and other non-conductors (and on other materials which are not generally amenable to ordinary electroplating techniques) using a coating technique involving an essentially solid polymer carbon-black-sulfur-containing coating adhered directly or through an intermediate layer onto a base, the invention is also applicable to bases having the requisite carbon black-polymer-sulfur composition. As an example, a sample of EPDM synthetic rubber having a volume resistivity of about 235 ohm-centimeters and containing reinforcing type, furnace carbon black and sulfur is directly plateable in a Watts-type nickel bath to provide a highly adherent, rapidly formed overall deposit of nickel. The spreading of the deposit from a point of metallic conduction differs somewhat in the case of a solid base of polymer-carbon black-sulfur from the spreading depicted in FIG. 1 of the drawing which is typical of metal spreading using coatings. With a solid polymer-carbon black-sulfur base the electrodeposited metals tends to rapidly film over the entire surface of the object blurring to a certain extent the metal deposition front depicted in FIG. 1 of the drawing.

In order to give those skilled in the art a better understanding and appreciation of the invention the following examples are given:

EXAMPLE I

A coating formulation was made up as follows:

| Material | Parts-by-weight |
|---|---|
| Natural Rubber (Smoked Sheet) | 100 |
| Nitrile Rubber (Paracril BJLT)[1] | 100 |
| Acetylene Carbon Black[2] | 100 |
| Sulfur | 4 |
| Trichloroethylene | 10,000 |

[1]Product of Uniroyal Chemical, Naugatuck, Conn.
[2]Product of Shawinigan Products Corp., Englewood Cliffs, N.J.

The aforedescribed coating formulation was sprayed on an acrylonitrile-butadiene-styrene (ABS) surface to provide a dried coating about 0.0025 cm. thick. The coated and dried ABS surface as then exposed for 40 seconds to the vapor above sulfur monochloride held at room temperature (about 25° C). The surface having a single metal contact as then placed in a Watts-type nickel plating bath as a cathode with a driving voltage of about 3 volts in opposition to a nickel anode. The nickel deposit grew rapidly across the coated ABS surface and deposition was continued until the deposited nickel had a substantially uniform thickness of about 0.0025 cm. The electrodeposit showed a 90° peel strength of about 1.88 kilogram per centimeter (kg/cm) width (10.5 lb/in width) when pulled at 2.54 cm/minute.

EXAMPLE II

The following coating formulations were prepared:

| Coating A | |
|---|---|
| Material | Parts-by-Weight |
| Nitrile Rubber (Paracril BLJT) | 9.87 |
| Stearic Acid | 0.099 |
| Zinc Oxide | 0.493 |
| Dibutyl Xanthogen Disulfide (C-P-B)[1] | 0.394 |
| Zinc diethyl dithiocarbamate (Ethazate)[1] | 0.025 |
| Dibenzylamine (D-B-A)[1] | 0.394 |
| Sulfur | 0.394 |
| Methyl Ethyl Ketone (MEK) | 11.3 |
| Xylene | 77.5 |

| Coating B | |
|---|---|
| Material | Parts-by-Weight |
| Acetylene Carbon Black | 4.39 |
| Nitrile Rubber (Paracril BJLT) | 8.78 |
| Stearic Acid | 0.088 |
| Zinc Oxide | 0.044 |
| Butyl Rubber | 0.044 |
| Dibutyl Xanthogen Disulfide (C-P-B)[1] | 0.351 |
| Zinc diethyl dithiocarbamate (Ethazate)[1] | 0.022 |
| Dibenzylamine (D-B-A)[1] | 0.351 |
| Sulfur | 0.351 |
| Trichloroethylene | 32.9 |
| Xylen | 52.6 |

[1]Products of Uniroyal Chemical, Naugatuck, Conn.

Coating A was applied by brushing onto a poly-(vinyl chloride) (PVC) plaque, and then coating B was applied in similar fashion over the dried coating A. After curing in an air oven for 3 hours at 90° C. the plaque was dipped into a 1 w/o solution of sulfur in cyclo-hexane, then plated to a thickness of about .001 inch with Watts nickel. Initially the nickel deposit grew rapidly across the surface of the plaque from a single metal contact. A 90° peel strength of 2.5 kg/cm (12 lb/in) was achieved for the electrodeposit.

EXAMPLE III

The following coating formulations were prepared:

| Coating C | |
|---|---|
| Material | Parts-by-Weight |
| Neoprene AF[1] | 50 |
| Neozone D[1] | 1 |
| Magnesia | 2 |
| Zinc Oxide | 2.5 |
| Alkyl Phenolic Resin (SP-135)[2] | 20 |
| Ethyl Acetate | 80 |
| Hexane | 82 |
| Toluene | 81 |
| Water | 0.5 |

| Coating D | |
|---|---|
| Material | Parts-by-Weight |
| Acetylene Carbon Black | 15 |
| Natural Rubber (Smoked Sheet) | 7.5 |
| Styrene Butediene Rubber (Naugapel 1503)[3] | 7.5 |
| Sulfur | 0.9 |
| Heptane | 240 |
| Turpentine | 70 |

| -continued | |
|---|---|
| Trichloroethylene | 75 |

¹Products of E.I. Dupont de Nemours and Co.
²Product of Schenectady Chemical Inc., Schenectady, N.Y.
³Product of Uniroyal Chemical, Naugatuck, Conn.

An ABS panel was dipped in coating C, air dried, then dipped into coating D, and again air dried. It was then directly electroplated in a Watts bath and the resulting nickel electro-deposit had a 90° peel strength of 1.79 kg/cm of width (10 lb/in.).

EXAMPLE IV

Coatings A and B from Example II were modified so that the concentration of curatives (C-P-B, Ethazate, D-B-A and sulfur) was doubled. In addition, MEK was added to coating A such that its final weight equaled that of the xylene (i.e., from 11.3 to 77.5). An ABS panel was successively dipped in modified coating A, then into modified coating B. The panel was cured at 85° C for 1½ hours, during which time a noticeable sulfur bloom appeared on the surface. The panel was then directly electroplated with Watts nickel with a rapid initial rate of coverage. The resulting metal deposit exhibited a 90° peel adhesion of about 3.58 kg/cm of width (20 lb/in).

EXAMPLE V

An ABS panel (Cycolac standard test plaque) was coated by successively dipping in first coating A, then coating B of Example II. After curing 15 hours in air at 85° C, the panel was dipped into a 1 w/o solution of sulfur in cyclohexane. It was then plated with a Watts FLASH, 0.0009 inch of semibright (Perflow) nickel, 0.0003 inch of bright (Udylite) nickel and 15μ in conventional chromium. The plated panel was given a thermal cycle of 90° C for 2 hours, room temperature for 1 hour, −40° C for 2 hours, and then given a 16-hour exposure to CASS testing. No detectable failure resulted on the panel from this treatment.

Those skilled in the art will appreciate that although in most of the foregoing examples ABS plastic plaques were used, the process of the present invention is equally as well adapted to the electroplating of utilitarian and decorative objects made of other plastics such as polystyrene, phenol formaldehyde resins, urea-formaldehyde resins, polyacrylates and methacrytates, polyurethane, silicones, vinyls, vinylidenes, epoxys, polyolefins and similar thermoplastic and thermosetting resinous materials. In addition, the process of the present invention can also be used to plate metals which are coated with non-metallic, non-electrically conductive coatings, e.g., varnished aluminum and the like. Those skilled in the art, in considering the scope of utility of the process of the present invention, will recognize that with some base materials it will be necessary to include an adhesive layer between the polymer carbon black plating substrate and the particular base material. While the form and character of the base material is not of significance to the operability of the process of the present invention, particular base materials can provide qualities of utility not ordinarily contemplated. For example, a loosely matted paper was coated with a polymer-carbon black-sulfur mixture to provide after metal deposition a novel useful electrode skeleton for a battery plaque, fuel cell electrode or the like. In this regard special attention is directed to the deposition of precious metals from Group VIII. While economic factors make it unlikely that platinum, palladium, rhodium, iridium, ruthenium and osmium would find much use in the decorative plating of plastics, these metals can be usefully deposited in the form of electrodes, catalysts, etc., where their particular chemical and electrochemical characteristics can be utilized.

EXAMPLE VI

A sample plastic treated and coated as in Example III was immersed as a cathode in an aqueous plating bath containing 300 gpl of ferrous chloride, 150 gpl of calcium chloride adjusted to a pH of 1.2 to 1.8 and held at a temperature of about 87° C. Upon passage of current through the bath at a voltage of 6 volts, the surface of the sample became covered with a smooth adherent coating of iron.

EXAMPLE VII

The sample of Example VI was immersed as a cathode in an aqueous cobalt plating bath containing about 335 gpl of cobalt sulfate, about 74 gpl of cobalt chloride, about 46.5 gpl of boric acid and about 1.2 gpl of sodium fluoborate. Upon passage of current through the bath, the sample rapidly filmed over with cobalt.

EXAMPLE VIII

One hundred parts by weight of a low-density, general purpose polyethylene were milled in a Banbury type mixer at a temperature of about 178° C. along with 50 parts by weight of Vulcan XC72 carbon black (supplied by Cabot Corporation) and Tetrone A brand dipentamethylenethiuram hexasulfide. The milled composition was then molded and the molding thus produced was inserted as a cathode in a nickel plating bath. Nickel rapidly spread over the surface from a metallic point of contact and plating was continued to provide a firm, adherent nickel electrodeposit having a 90% peel strength of about 1.8 kg/cm of width.

Although the present invention has been described and illustrated in conjunction with preferred embodiments, it is to be understood that modifications and variations may be resorted to without departing from the spirit and scope of the invention. For example, those skilled in the art will appreciate that the molding composition upon which nickel was deposited in Example VIII is illustrative of a broader range of polyethylene, polypropylene and mixtures and copolymers thereof having blended therein about 15% to about 60% by weight (of the total composition) of carbon black, to give a volume resistivity of less than about 1000 ohm-centimeters, along with sulfur or a sulfur donor for example of the dipentamethylenethiuran hexasulfide type in an amount equivalent in sulfur content to about 1% to about 10% by weight (of the total composition) of dipentamethylenethiuram hexasulfide. In plating massive polymer bodies as in Example VIII an interesting phenomenon has been noted, that is, the bond strength of nickel electrodeposited on the polymer surface improves with aging at room temperature. Thus the 90° peel strength set forth in Example VIII is the peel strength observed immediately after plating. After a few days aging the observed bond strength is often double (or more) of that strength as set forth in Example VIII. Such compositional and processing modifications and variations are considered to be within the purview and scope of the invention and appended claims.

I claim:

1. A cathode adapted to be employed in a process of electrodeposition wherein metal of Group VIII of the periodic table is electrodeposited directly thereon comprising a structure formed from a composition comprising a polymer from the group of polyethylene, polypropylene and mixtures and copolymers thereof and, in percent by weight of the total composition, about 15% to about 60% of carbon black and a material from the group of sulfur and sulfur donors in an amount equivalent in sulfur content to about 1% to about 10% of dipentamethylenethiuram hexasulfide, said carbon black being in an amount sufficient to provide in said composition of matter in massive form an electrical volume resistivity of less than about 1000 ohm-centimeters, the sulfur and carbon black being present in said composition of matter in cooperative amounts sufficient to induce rapid coverage of said composition of matter with Group VIII metal when said cathode is employed in a Group VIII metal electrodeposition bath.

2. A cathode as in claim 1 wherein the structure is made of a composition containing polyethylene, carbon black and dipentamethylenethiuram hexasulfide.

* * * * *